US012660279B2

(12) United States Patent
Fukuda et al.

(10) Patent No.: US 12,660,279 B2
(45) Date of Patent: Jun. 16, 2026

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Taichi Fukuda, Yokohama (JP); Yusuke Kobayashi, Yokohama (JP); Shotaro Baba, Kawasaki (JP); Hiro Gangi, Tokyo (JP); Hiroki Nemoto, Nonoichi (JP); Tomoaki Inokuchi, Yokohama (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 313 days.

(21) Appl. No.: 18/586,688

(22) Filed: Feb. 26, 2024

(65) Prior Publication Data

US 2025/0048708 A1 Feb. 6, 2025

(30) Foreign Application Priority Data

Aug. 2, 2023 (JP) ................................. 2023-126429

(51) Int. Cl.
H10D 64/00 (2025.01)
H10D 30/66 (2025.01)

(52) U.S. Cl.
CPC ......... H10D 64/118 (2025.01); H10D 30/668 (2025.01); H10D 64/117 (2025.01)

(58) Field of Classification Search
CPC ... H10D 64/117; H10D 30/668; H10D 64/118
See application file for complete search history.

(56) References Cited

U.S. PATENT DOCUMENTS

| | | | |
|---|---|---|---|
| 2010/0019250 A1 | 1/2010 | Nakamura et al. | |
| 2011/0169103 A1* | 7/2011 | Darwish .............. | H10D 62/158 |
| | | | 257/E29.262 |
| 2016/0087064 A1 | 3/2016 | Ohashi et al. | |
| 2020/0058778 A1 | 2/2020 | Fukunaga et al. | |
| 2022/0293785 A1* | 9/2022 | Kobayashi ........... | H10D 30/667 |
| 2022/0393008 A1* | 12/2022 | Kobayashi ........... | H10D 30/668 |

FOREIGN PATENT DOCUMENTS

| | | |
|---|---|---|
| JP | 2007194283 A | 8/2007 |
| JP | 2016066641 A | 4/2016 |
| JP | 2022137413 A | 9/2022 |
| JP | 2022185245 A | 12/2022 |
| WO | 2018078775 A1 | 5/2018 |

* cited by examiner

*Primary Examiner* — Steven M Page
(74) *Attorney, Agent, or Firm* — Maier & Maier, PLLC

(57) ABSTRACT

An insulating member includes a fixed charge. The insulating member includes a first insulating part. The first insulating part includes a first region, a second region, and a third region. The first region is positioned between a gate electrode and the second region in a first direction. The second region is positioned between the first region and the third region in the first direction. The third region is positioned between the second region and a second surface in the first direction. A density of the fixed charge is greater in the first region than in the second region.

14 Claims, 2 Drawing Sheets

SEMICONDUCTOR DEVICE

CROSS-REFERENCE TO RELATED APPLICATION

This application is based upon and claims the benefit of priority from Japanese Patent Application No. 2023-126429, filed on Aug. 2, 2023; the entire contents of which are incorporated herein by reference.

FIELD

Embodiments described herein relate generally to a semiconductor device.

BACKGROUND

A semiconductor device has been proposed in which a field plate electrode, to which a source potential is applied, and a gate electrode are included inside a trench formed in a semiconductor layer.

DETAILED DESCRIPTION

Figures 1A, 1B:
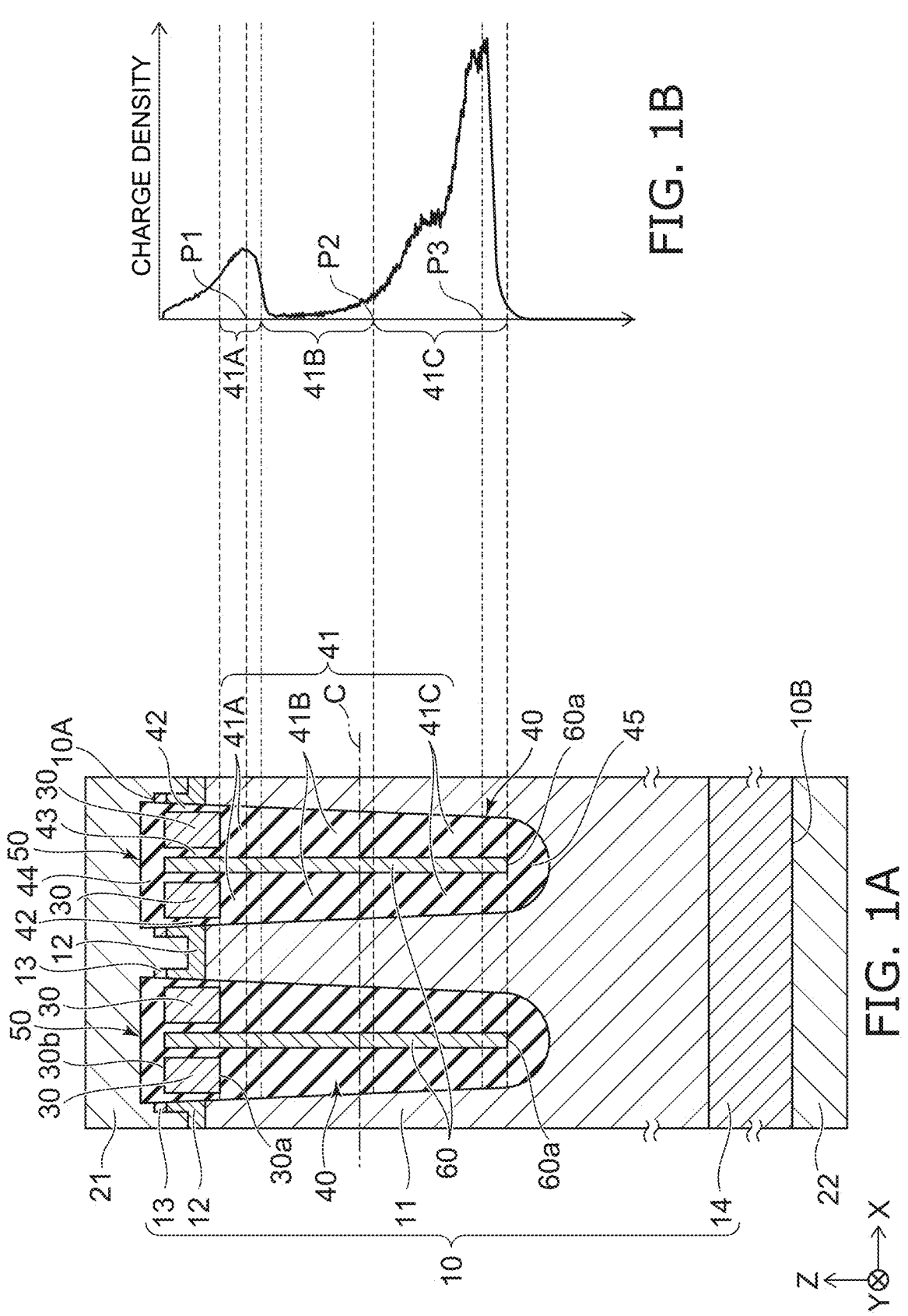
FIG. 1A is a schematic cross-sectional view of a semiconductor device of an embodiment.
FIG. 1B is a graph showing a fixed charge density distribution in a first direction of an insulating member of the semiconductor device of the embodiment.

According to one embodiment, a semiconductor device includes a semiconductor layer including a first surface and a second surface, the second surface being positioned at a side opposite to the first surface in a first direction; and a trench structure part positioned inside the semiconductor layer, the trench structure part extending in the first direction from the first surface. The trench structure part includes a gate electrode, a conductive member including a lower end portion, the lower end portion being positioned more proximate to the second surface than the gate electrode in the first direction, and an insulating member positioned between the gate electrode and the semiconductor layer, between the conductive member and the semiconductor layer, and between the gate electrode and the conductive member, the insulating member including a fixed charge. The insulating member includes a first insulating part positioned between the gate electrode and the second surface in the first direction and positioned between the conductive member and the semiconductor layer in a second direction crossing the first direction. The first insulating part includes a first region, a second region, and a third region. The first region is positioned between the gate electrode and the second region in the first direction, the second region is positioned between the first region and the third region in the first direction, the third region is positioned between the second region and the second surface in the first direction. A first total amount of the fixed charge in the first region is greater than a second total amount of the fixed charge in the second region.

Embodiments will now be described with reference to the drawings.

The drawings are schematic or conceptual; and the relationships between the thickness and width of portions, the proportions of sizes among portions, etc., are not necessarily the same as the actual values. The dimensions and proportions may be illustrated differently among drawings, even when the same portion is illustrated.

The same or similar components are marked with the same reference numerals.

As shown in FIG. 1A, the semiconductor device of the embodiment includes a semiconductor layer 10 and a trench structure part 50.

The semiconductor layer 10 includes a first surface 10A, and a second surface 10B positioned at the side opposite to the first surface 10A in a first direction Z. The first direction Z is the direction from the first surface 10A toward the second surface 10B. In FIG. 1A, a direction crossing the first direction Z is taken as a second direction X. For example, the second direction X is orthogonal to the first direction Z. A direction crossing the first and second directions Z and X is taken as a third direction Y. For example, the third direction Y is orthogonal to the first and second directions Z and X. The first surface 10A and the second surface 10B extend along the second and third directions X and Y.

For example, silicon can be used as the material of the semiconductor layer 10. Or, for example, silicon carbide, gallium nitride, etc., may be used as the material of the semiconductor layer 10.

The trench structure part 50 extends in the first direction Z from the first surface 10A, and is positioned inside the semiconductor layer 10. The trench structure part 50 also extends in the third direction Y. For example, multiple trench structure parts 50 are arranged inside the semiconductor layer to be separated from each other in the second direction X. Or, multiple columnar trench structure parts 50 may be arranged in the second and third directions X and Y.

The trench structure part 50 includes a gate electrode 30, a conductive member 60, and an insulating member 40.

The gate electrode 30 includes an upper end portion 30$b$ and a lower end portion 30$a$. The position in the first direction Z of the upper end portion 30$b$ is between the position in the first direction Z of the first surface 10A and the position in the first direction Z of the lower end portion 30$a$. For example, conductive polycrystalline silicon can be used as the material of the gate electrode 30.

The conductive member 60 includes a lower end portion 60$a$ that is positioned more proximate to the second surface 10B than the gate electrode 30 in the first direction Z. For example, one trench structure part 50 includes two gate electrodes 30 positioned to be separated from each other in the second direction X. For example, the conductive member 60 is positioned between the two gate electrodes 30. The conductive member 60 extends in the first direction Z toward the second surface 10B side from the portion positioned between the two gate electrodes 30. For example, conductive polycrystalline silicon can be used as the material of the conductive member 60.

The conductive member 60 is electrically connected with a first electrode 21, which is described below. Or, a potential that is lower than that of a second electrode 22 (described below), to which a higher potential than that of the first electrode 21 is applied, may be applied to the conductive member 60. The conductive member 60 can relax the electric field applied in the first direction Z (hereinbelow, also called the vertical electric field), and can increase the breakdown voltage.

The insulating member 40 is positioned between the gate electrode 30 and the semiconductor layer 10, between the conductive member 60 and the semiconductor layer 10, and between the gate electrode 30 and the conductive member 60. For example, silicon oxide, BPSG (boro-phospho silicate glass), or the like can be used as the material of the insulating member 40.

The insulating member 40 includes a first insulating part 41 that is positioned between the second surface 10B and the lower end portion 30a of the gate electrode 30 in the first direction Z and positioned between the conductive member 60 and the semiconductor layer 10 in the second direction X.

The insulating member 40 further includes a second insulating part 42, a third insulating part 43, a fourth insulating part 44, and a fifth insulating part 45.

The second insulating part 42 is positioned between the semiconductor layer 10 and the side surface of the gate electrode in the second direction X. The second insulating part 42 and the first insulating part 41 are discriminated from each other with the position in the first direction Z of the lower end portion 30a of the gate electrode 30 as a boundary.

The third insulating part 43 is positioned between the side surface of the gate electrode 30 and the side surface of the conductive member 60 in the second direction X.

The fourth insulating part 44 is positioned between the first electrode 21 and the upper end portion 30b of the gate electrode 30 in the first direction Z.

The fifth insulating part 45 is positioned between the semiconductor layer 10 and the lower end portion 60a of the conductive member 60 and between the semiconductor layer 10 and the first insulating part 41 in the first direction Z. The fifth insulating part 45 and the first insulating part 41 are discriminated from each other with the position in the first direction Z of the lower end portion 60a of the conductive member 60 as a boundary.

At least the first insulating part 41 of the insulating member 40 includes a first element. The first element includes at least one selected from the group consisting of hydrogen, helium, and argon. At least the first insulating part 41 of the insulating member 40 includes a fixed charge. The first element functions as the fixed charge. In the specification, the first element and defects created in regions through which the first element passes when implanting are considered synonymous with the fixed charge. The fixed charge amount can be read as the sum total of the first element amount and the defect amount created in regions through which the first element passed when implanting. Expressions of the magnitude relationship of the fixed charge amount can be read as the magnitude relationship of the sum total of the first element amount and the defect amount created in the regions through which the first element passed when implanting. The fixed charge density can be read as the sum total of the first element concentration and the defect density created in the regions through which the first element passed when implanting. Expressions of the magnitude relationship of the fixed charge density can be read as the magnitude relationship of the sum total of the first element concentration and the defect density created in the regions through which the first element passed when implanting. For example, the first element is implanted into the insulating member 40 from the first surface 10A side by being accelerated in the first direction Z with an energy of not less than 100 keV.

The first insulating part 41 includes a first region 41A, a second region 41B, and a third region 41C. The first region 41A is positioned between the second region 41B and the lower end portion 30a of the gate electrode 30 in the first direction Z. The second region 41B is positioned between the first region 41A and the third region 41C in the first direction Z. The third region 41C is positioned between the second region 41B and the second surface 10B in the first direction Z. The first region 41A and the second region 41B contact each other. The second region 41B and the third region 41C contact each other. The first insulating part 41 includes a portion between the position in the first direction Z of the lower end portion 30a of the gate electrode 30 and the position in the first direction Z of the lower end portion 60a of the conductive member 60; and the first insulating part 41 includes a first position P1 internally dividing the portion in a ratio of 1:9, a second position P2 internally dividing the portion in a ratio of 1:1, and a third position P3 internally dividing the portion in a ratio of 9:1. The first region 41A includes the first position P1. The third region 41C includes the third position P3.

The position of the first region 41A at the side opposite to the second region 41B in the first direction Z is aligned with the position in the first direction Z of the lower end portion 30a of the gate electrode 30.

For example, the boundary between the first region 41A and the second region 41B is positioned more proximate to the first surface 10A than a bisector C in the first direction Z of the trench structure part 50. The bisector C bisects, in the first direction Z, the portion of the trench structure part 50 between the position in the first direction Z of the lower end portion 30a of the gate electrode 30 and the position in the first direction Z of the lower end portion 60a of the conductive member 60.

For example, the boundary between the second region 41B and the third region 41C is positioned more proximate to the second surface 10B than the bisector C. Or, the boundary between the second region 41B and the third region 41C may be aligned with the bisector C.

The position of the third region 41C at the side opposite to the second region 41B in the first direction Z is aligned with the position in the first direction Z of the lower end portion 60a of the conductive member 60.

For example, the position in the first direction Z of the lower end portion 30a of the gate electrode 30 is within the range of not less than 0.5 μm and not more than 2.0 μm from the first surface 10A.

For example, the boundary between the first region 41A and the second region 41B is within the range of not less than 1.0 μm and not more than 3.0 μm from the first surface 10A.

For example, the position in the first direction Z of the lower end portion 60a of the conductive member 60 is within the range of not less than 4.5 μm and not more than 10.0 μm from the first surface 10A.

FIG. 1B is a graph showing the fixed charge density distribution in the first direction Z of the insulating member 40 calculated by a simulation.

According to the embodiment, a first total amount of the fixed charge in the first region 41A is greater than a second total amount of the fixed charge in the second region 41B. A first maximum value of the fixed charge density distribution along the first direction Z in the first region 41A is greater than a second maximum value of the fixed charge density distribution along the first direction Z in the second region 41B. The fixed charge density in the first region 41A is greater than the fixed charge density in the second region 41B. The fixed charge density in the first region 41A is, for example, greater than $1 \times 10^{15}$ cm$^{-3}$. The first region 41A includes a portion at which the fixed charge density is greater than $2 \times 10^{15}$ cm$^{-3}$. The second region 41B includes a portion at which the fixed charge density is less than $1 \times 10^{15}$ cm$^{-3}$. The fixed charge density (a first element concentration) at the first position P1 is greater than the fixed charge density (the first element concentration) at the second position P2. The fixed charge density at the first position P1 is greater than $2 \times 10^{15}$ cm$^{-3}$.

By such a fixed charge of the first region 41A, in the potential distribution of the semiconductor layer 10 when the first electrode 21, the second electrode 22, the gate electrode 30, and the conductive member 60 are 0 V, carriers (as described below, electrons in the case of an n-type MOSFET) from a channel described below can be accumulated in a region of the semiconductor layer 10 into which the carriers are injected. As a result, spreading of the current in the carrier injection region of the semiconductor layer 10 can be suppressed, and the on-resistance can be reduced.

A third total amount of the fixed charge in the third region 41C is greater than the second total amount of the fixed charge in the second region 41B. A third maximum value of the fixed charge density distribution along the first direction Z in the third region 41C is greater than the second maximum value of the fixed charge density distribution along the first direction Z in the second region 41B. The third maximum value of the fixed charge density distribution along the first direction Z in the third region 41C is greater than the first maximum value of the fixed charge density distribution along the first direction Z in the first region 41A. The fixed charge density in the third region 41C is greater than the fixed charge density in the second region 41B. The fixed charge density in the third region 41C is greater than the fixed charge density in the fifth insulating part 45. The fixed charge density in the third region 41C is, for example, greater than $1 \times 10^{15}$ cm$^{-3}$. The third region 41C includes a portion at which the fixed charge density is greater than $1 \times 10^{15}$ cm$^{-3}$. The fixed charge density (the first element concentration) at the third position P3 is greater than the fixed charge density (the first element concentration) at the second position P2. The fixed charge density at the third position P3 is greater than $1 \times 10^{16}$ cm$^{-3}$.

Such a fixed charge of the third region 41C can relax the vertical electric field that easily concentrates at the corner of the lower end portion 60a of the conductive member 60, and can increase the breakdown voltage.

The semiconductor device of the embodiment further includes the first electrode 21 located at the first surface 10A, and the second electrode 22 located at the second surface 10B. The semiconductor layer 10 includes an n-type first semiconductor part 11, a p-type second semiconductor part 12, and an n-type third semiconductor part 13. The n-type impurity concentration of the third semiconductor part 13 is greater than the n-type impurity concentration of the first semiconductor part 11.

The first semiconductor part 11 is located on the second electrode 22; the second semiconductor part 12 is located on the first semiconductor part 11; and the third semiconductor part 13 is located on the second semiconductor part 12.

The first electrode 21 contacts the third semiconductor part 13, and is electrically connected with the third semiconductor part 13. The first semiconductor part 11 is adjacent to the first insulating part 41 in the second direction X. The second semiconductor part 12 faces the side surface of the gate electrode 30 via the second insulating part 42 in the second direction X. The second semiconductor part 12 contacts the first electrode 21, and is electrically connected with the first electrode 21.

The semiconductor layer 10 can further include an n-type fourth semiconductor part 14 located between the second electrode 22 and the first semiconductor part 11. The n-type impurity concentration of the fourth semiconductor part 14 is greater than the n-type impurity concentration of the first semiconductor part 11. The fourth semiconductor part 14 is electrically connected with the second electrode 22.

For example, the semiconductor device of the embodiment has a MOSFET (Metal-Oxide-Semiconductor Field Effect Transistor) structure. For example, the first electrode 21 functions as a source electrode; the second electrode 22 functions as a drain electrode; the first semiconductor part 11 functions as a drift layer; the second semiconductor part 12 functions as a base layer; the third semiconductor part 13 functions as a source layer; and the fourth semiconductor part 14 functions as a drain layer.

An n-type inversion layer (a channel) is formed in the portion of the second semiconductor part 12 facing the gate electrode 30 when a first potential (e.g., a ground potential) is applied to the first electrode 21, a second potential (e.g., a positive potential) that is higher than the first potential is applied to the second electrode 22, and a gate voltage that is not less than a threshold is applied to the gate electrode 30. Then, a current flows between the second electrode 22 (the drain electrode) and the first electrode 21 (the source electrode) via the fourth semiconductor part 14 (the drain layer), the channel, and the third semiconductor part 13 (the source layer).

By introducing a positive fixed charge to the first region 41A described above, electrons can be accumulated in the region of the first semiconductor part 11 adjacent to the first region 41A; spreading of the electron current can be suppressed; and the on-resistance can be reduced.

Figure 2A:
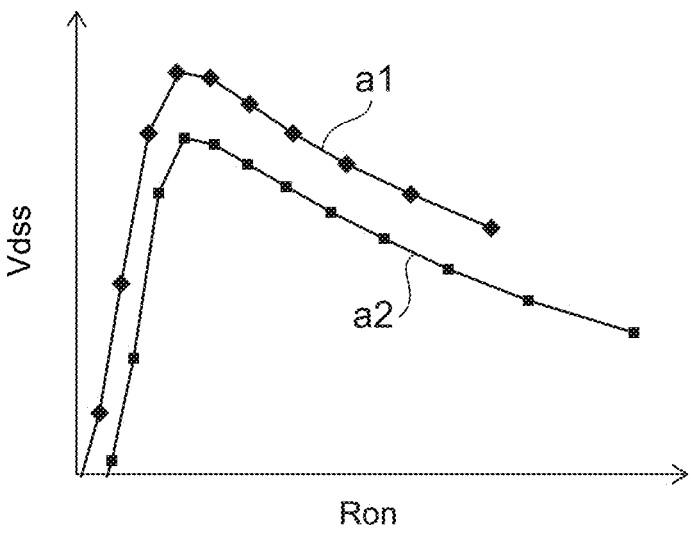
FIG. 2A is a graph showing Ron-Vdss characteristics.

FIG. 2A is a graph showing the relationship between the on-resistance Ron (the horizontal axis) and the breakdown voltage Vdss (the vertical axis) calculated by a simulation. A characteristic a1 is the Ron-Vdss characteristic of the semiconductor device of the embodiment described above. A characteristic a2 is the Ron-Vdss characteristic of a semiconductor device of a comparative example. The semiconductor device of the comparative example has a structure similar to that of the semiconductor device of the embodiment, but the insulating member does not include a fixed charge.

The results of FIG. 2A show that according to the semiconductor device of the embodiment, the fixed charge density distribution of the insulating member 40 such as that shown in FIG. 1B above obtains a low on-resistance Ron and a high breakdown voltage Vdss compared to the comparative example.

Figure 2B:
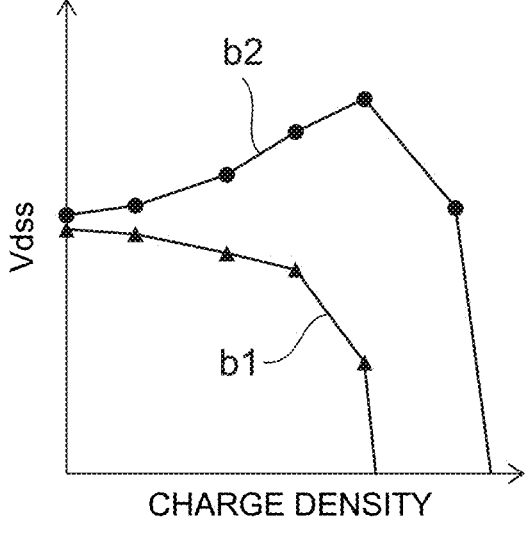
FIG. 2B is a graph showing charge density dependence of a breakdown voltage.

FIG. 2B is a graph showing the relationship between the charge density (the horizontal axis) and the breakdown voltage Vdss (the vertical axis) calculated by a simulation. A characteristic b1 is the characteristic when the fixed charge is introduced to only the first region 41A of the first insulating part 41. A characteristic b2 is the characteristic when the fixed charge is introduced to only the third region 41C of the first insulating part 41.

The characteristic b1 for which the fixed charge is introduced to the first region 41A starts from a breakdown voltage Vdss that is about the same as that of the characteristic b2, but the breakdown voltage decreases as the fixed charge density increases. In contrast, the characteristic b2 for which the fixed charge is introduced to the third region 41C starts from a breakdown voltage Vdss that is about the same as that of the characteristic b1, and the breakdown voltage increases to some value as the fixed charge density increases. Accordingly, it is favorable for the third total amount of the fixed charge in the third region 41C to be greater than the first total amount of the fixed charge in the first region 41A. It is favorable for the third maximum value of the fixed charge density distribution along the first direction Z in the third region 41C to be greater than the first maximum value of the fixed charge density distribution along the first direction Z in the first region 41A.

In both the case where the fixed charge is introduced to the third region 41C (the characteristic b2) and the case where the fixed charge is introduced to the first region 41A (the characteristic b1), the breakdown voltage greatly decreases when the fixed charge density becomes too large. Therefore, for example, it is favorable for the first maximum value described above to be not more than $1.0 \times 10^{13}$ cm$^{-2}$ when converted into the surface charge density at the interface between the first insulating part 41 and the semiconductor layer 10. For example, it is favorable for the third maximum value described above to be not more than $1.0 \times 10^{14}$ cm$^{-2}$ when converted into the surface charge density at the interface between the first insulating part 41 and the semiconductor layer 10.

For example, the fixed charge density can be measured by a method such as ESR (Electron Spin Resonance), SIMS (Secondary Ion Mass Spectrometry), etc. Also, the presence of a fixed charge in an oxide film can be estimated indirectly by measuring defects in the semiconductor layer by using a method such as DLTS (Deep Level Transient Spectroscopy), SR (Spreading Resistance), etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
a semiconductor layer including a first surface and a second surface, the second surface being positioned at a side opposite to the first surface in a first direction; and
a trench structure part positioned inside the semiconductor layer, the trench structure part extending in the first direction from the first surface,
the trench structure part including
a gate electrode,
a conductive member including a lower end portion, the lower end portion being positioned more proximate to the second surface than the gate electrode in the first direction, and
an insulating member positioned between the gate electrode and the semiconductor layer, between the conductive member and the semiconductor layer, and between the gate electrode and the conductive member, the insulating member including a fixed charge,
the insulating member including a first insulating part positioned between the gate electrode and the second surface in the first direction and positioned between the conductive member and the semiconductor layer in a second direction crossing the first direction,
the first insulating part including a first region, a second region, and a third region,
the first region being positioned between the gate electrode and the second region in the first direction,
the second region being positioned between the first region and the third region in the first direction, the third region being positioned between the second region and the second surface in the first direction,
a first total amount of the fixed charge in the first region being greater than a second total amount of the fixed charge in the second region.

2. The device according to claim 1, wherein a third total amount of the fixed charge in the third region is greater than the second total amount.

3. The device according to claim 1, wherein the third total amount is greater than the first total amount.

4. A semiconductor device, comprising:
a semiconductor layer including a first surface and a second surface, the second surface being positioned at a side opposite to the first surface in a first direction; and
a trench structure part positioned inside the semiconductor layer, the trench structure part extending in the first direction from the first surface,
the trench structure part including
a gate electrode,
a conductive member including a lower end portion, the lower end portion being positioned more proximate to the second surface than the gate electrode in the first direction, and
an insulating member positioned between the gate electrode and the semiconductor layer, between the conductive member and the semiconductor layer, and between the gate electrode and the conductive member, the insulating member including a fixed charge,
the insulating member including a first insulating part positioned between the gate electrode and the second surface in the first direction and positioned between the conductive member and the semiconductor layer in a second direction crossing the first direction,
the first insulating part including a first region, a second region, and a third region,
the first region being positioned between the gate electrode and the second region in the first direction,
the second region being positioned between the first region and the third region in the first direction,
the third region being positioned between the second region and the second surface in the first direction,
a density of the fixed charge being greater in the first region than in the second region.

5. The device according to claim 4, wherein the density of the fixed charge is greater in the third region than in the second region.

6. The device according to claim 5, wherein a maximum value of a density distribution of the fixed charge along the first direction in the first region is not more than $1.0 \times 10^{13}$ cm$^{-2}$ when converted into a surface charge density at an interface between the first insulating part and the semiconductor layer.

7. The device according to claim 5, wherein a maximum value of a density distribution of the fixed charge along the first direction in the third region is not more than $1.0 \times 10^{14}$ cm$^{-2}$ when converted into a surface charge density of an interface between the first insulating part and the semiconductor layer.

8. The device according to claim 1, wherein the fixed charge includes at least one selected from the group consisting of hydrogen, helium, and argon.

9. The device according to claim 1, further comprising:
a first electrode located at the first surface; and
a second electrode located at the second surface,
the semiconductor layer including a first semiconductor part located on the second electrode, the first semiconductor part being of a first conductivity type, a second semiconductor part located on the first semiconductor part, the second semiconductor part being of a second conductivity type, and a third semiconductor part located on the second semiconductor part, the third semiconductor part being electrically connected with the first electrode, the third semiconductor part being of the first conductivity type.

10. The device according to claim 9, wherein the conductive member is electrically connected with the first electrode.

11. The device according to claim 1, wherein the first region includes a portion at which a density of the fixed charge is greater than $2 \times 10^{15}$ cm$^{-3}$, the second region includes a portion at which the density of the fixed charge is less than $1 \times 10^{15}$ cm$^{-3}$, and the third region includes a portion at which the density of the fixed charge is greater than $5 \times 10^{15}$ cm$^{-3}$.

12. A semiconductor device, comprising:

a semiconductor layer including a first surface and a second surface, the second surface being positioned at a side opposite to the first surface in a first direction; and a trench structure part positioned inside the semiconductor layer, the trench structure part extending in the first direction from the first surface, the trench structure part including a gate electrode, a conductive member including a lower end portion, the lower end portion being positioned more proximate to the second surface than the gate electrode in the first direction, an insulating member positioned between the gate electrode and the semiconductor layer, between the conductive member and the semiconductor layer, and between the gate electrode and the conductive member, the insulating member including a first element, the first element including at least one selected from the group consisting of hydrogen, helium, and argon, the insulating member including a first insulating part positioned between the gate electrode and the second surface in the first direction and positioned between the conductive member and the semiconductor layer in a second direction crossing the first direction, the first insulating part including a portion between a position in the first direction of an end portion of the gate electrode at the second surface side in the first direction and a position in the first direction of an end portion of the conductive member at the second surface side in the first direction, the first insulating part including a first position internally dividing the portion in a ratio of 1:9, a second position internally dividing the portion in a ratio of 1:1, and a third position internally dividing the portion in a ratio of 9:1, a first element concentration being greater at the first position than at the second position, the first element concentration being greater at the third position than at the second position.

13. The device according to claim 4, wherein the fixed charge includes at least one selected from the group consisting of hydrogen, helium, and argon.

14. The device according to claim 4, further comprising:

a first electrode located at the first surface; and a second electrode located at the second surface, the semiconductor layer including a first semiconductor part located on the second electrode, the first semiconductor part being of a first conductivity type, a second semiconductor part located on the first semiconductor part, the second semiconductor part being of a second conductivity type, and a third semiconductor part located on the second semiconductor part, the third semiconductor part being electrically connected with the first electrode, the third semiconductor part being of the first conductivity type.

* * * * *